United States Patent
Roh et al.

(10) Patent No.: US 8,607,112 B2
(45) Date of Patent: Dec. 10, 2013

(54) ENHANCED BLOCK CODING METHOD BASED ON SMALL SIZE BLOCK CODE

(75) Inventors: Dongwook Roh, San Diego, CA (US);
Joonkui Ahn, Gyeonggi-Do (KR);
Mingyu Kim, Gyeonggi-Do (KR);
Daewon Lee, Gyeonggi-Do (KR);
Suckchel Yang, Gyeonggi-Do (KR);
Kijun Kim, Gyeonggi-Do (KR);
Dongyoun Seo, Gyeonggi-Do (KR)

(73) Assignee: LG Electronics Inc., Seoul (KR)

( * ) Notice: Subject to any disclaimer, the term of this patent is extended or adjusted under 35 U.S.C. 154(b) by 225 days.

(21) Appl. No.: 13/103,252

(22) Filed: May 9, 2011

(65) Prior Publication Data

US 2012/0008666 A1    Jan. 12, 2012

Related U.S. Application Data

(60) Provisional application No. 61/333,550, filed on May 11, 2010.

(51) Int. Cl.
*H03M 13/00* (2006.01)

(52) U.S. Cl.
USPC .............. 714/746; 714/748; 714/752

(58) Field of Classification Search
USPC .......... 714/746, 748, 749, 751, 752, 761, 799
See application file for complete search history.

(56) References Cited

U.S. PATENT DOCUMENTS

| | | |
|---|---|---|
| 2003/0174669 A1 | 9/2003 | Roh et al. |
| 2009/0168904 A1 | 7/2009 | Roh et al. |
| 2009/0175361 A1 | 7/2009 | Roh et al. |
| 2010/0182898 A1* | 7/2010 | Li et al. .......... 370/208 |
| 2011/0228863 A1* | 9/2011 | Papasakellariou et al. ... 375/259 |
| 2011/0239076 A1* | 9/2011 | Liu et al. ............ 714/751 |
| 2011/0249578 A1* | 10/2011 | Nayeb Nazar et al. ....... 370/252 |

FOREIGN PATENT DOCUMENTS

| | | |
|---|---|---|
| EP | 1195911 A2 | 4/2002 |
| KR | 10-2003-0068749 A | 8/2003 |
| KR | 10-2009-0069126 A | 6/2009 |
| KR | 10-2009-0069127 A | 6/2009 |

OTHER PUBLICATIONS

U.S. Appl. No. 61/293,412, filed Jan. 2010, Nayeb Nazar et al.*
U.S. Appl. No. 61/329,743, filed Apr. 2010, Nayeb Nazar et al.*
Varga, I.; De Lacovo, R.D.; Usai, P., "Standardization of the AMR wideband speech codec in 3GPP and ITU-T," Communications Magazine, IEEE , vol. 44, No. 5, pp. 66,73, May 2006.*
Prasad, R.; Ojanpera, T., "An overview of CDMA evolution toward wideband CDMA," Communications Surveys & Tutorials, IEEE , vol. 1, No. 1, pp. 2,29, First Quarter 1998.*

* cited by examiner

*Primary Examiner* — Cynthia Britt
(74) *Attorney, Agent, or Firm* — Birch, Stewart, Kolasch & Birch, LLP

(57) ABSTRACT

A scheme of enhanced block coding based on small size block code is provided. Such is achieved by obtaining extended basis sequences for a (32, O) code with O=1, 2, . . . 12; selecting an offset starting value that produces maximum error correction capability in each O value; and generating basis sequences for a (48, O) code based on the obtained extended basis sequences for the (32, O) code with the offset starting value selected based on the selecting step. The offset starting value could be selected as 18, which results in the largest sum of distances.

12 Claims, 13 Drawing Sheets

| # of carriers | 1 | 2 | 3 | 4 | 5 |
|---|---|---|---|---|---|
| # of ACK/NACK | 1 | 2 | 3 | 4 | 5 |
| # of ACK/NACK states | 2 | $4=2^2$ | $8=2^3$ | $16=2^4$ | $32=2^5$ |
| # of bits | 1 | 2 | 3 | 4 | 5 |

Table 1: # of bits per # of ACK/NACKs

| # of carriers | 1 | 2 | 3 | 4 | 5 |
|---|---|---|---|---|---|
| # of ACK/NACK | 2 | 4 | 6 | 8 | 10 |
| # of ACK/NACK states | 4 | $16=4^2$ | $64=4^3$ | $256=4^4$ | $1024=4^5$ |
| # of bits | 2 | 4 | 6 | 8 | 10 |

Table 2: # of bits per # of ACK/NACKs

FIG. 8

| # of carriers | 1 | 2 | 3 | 4 | 5 |
|---|---|---|---|---|---|
| # of ACK/NACK states (DTX included) | 3 | $9=3^2$ | $27=3^3$ | $81=3^4$ | $243=3^5$ |
| # of bits | 2 | 4 | 5 | 7 | 8 |

Table 3: # of bits per # of ACK/NACKs including DTX

FIG. 9

| # of carriers | 1 | 2 | 3 | 4 | 5 |
|---|---|---|---|---|---|
| # of ACK/NACK states (DTX included) | 5 | $25=5^2$ | $125=5^3$ | $625=5^4$ | $3125=5^5$ |
| # of bits | 3 | 5 | 7 | 10 | 12 |

Table 4: # of bits per # of ACK/NACKs including DTX

FIG. 10

Table 5: Basis sequences for (32, O) code

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ |
|---|---|---|---|---|---|---|---|---|---|---|---|
| 0 | 1 | 1 | 0 | 0 | 0 | 0 | 0 | 0 | 0 | 0 | 1 |
| 1 | 1 | 1 | 1 | 0 | 0 | 0 | 0 | 0 | 0 | 1 | 1 |
| 2 | 1 | 0 | 0 | 1 | 0 | 0 | 1 | 0 | 1 | 1 | 1 |
| 3 | 1 | 0 | 1 | 1 | 0 | 0 | 0 | 0 | 1 | 0 | 1 |
| 4 | 1 | 1 | 1 | 1 | 0 | 0 | 0 | 1 | 0 | 0 | 1 |
| 5 | 1 | 1 | 0 | 0 | 1 | 0 | 1 | 1 | 1 | 0 | 1 |
| 6 | 1 | 0 | 1 | 0 | 1 | 0 | 1 | 0 | 1 | 1 | 1 |
| 7 | 1 | 0 | 0 | 1 | 1 | 0 | 0 | 1 | 1 | 0 | 1 |
| 8 | 1 | 1 | 0 | 1 | 1 | 0 | 0 | 1 | 0 | 1 | 1 |
| 9 | 1 | 0 | 1 | 1 | 1 | 0 | 1 | 0 | 0 | 1 | 1 |
| 10 | 1 | 0 | 1 | 0 | 0 | 1 | 1 | 1 | 0 | 1 | 1 |
| 11 | 1 | 1 | 1 | 0 | 0 | 1 | 1 | 0 | 1 | 0 | 1 |
| 12 | 1 | 0 | 0 | 1 | 0 | 1 | 0 | 1 | 1 | 1 | 1 |
| 13 | 1 | 1 | 0 | 1 | 0 | 1 | 0 | 1 | 0 | 1 | 1 |
| 14 | 1 | 0 | 0 | 0 | 1 | 1 | 0 | 1 | 0 | 0 | 1 |
| 15 | 1 | 1 | 0 | 0 | 1 | 1 | 1 | 1 | 0 | 1 | 1 |
| 16 | 1 | 1 | 1 | 0 | 1 | 1 | 1 | 0 | 0 | 1 | 0 |
| 17 | 1 | 0 | 0 | 1 | 1 | 1 | 0 | 0 | 1 | 0 | 0 |
| 18 | 1 | 1 | 0 | 1 | 1 | 1 | 1 | 1 | 0 | 0 | 0 |
| 19 | 1 | 0 | 0 | 0 | 0 | 1 | 1 | 0 | 0 | 0 | 0 |
| 20 | 1 | 0 | 1 | 0 | 0 | 0 | 1 | 0 | 0 | 0 | 1 |
| 21 | 1 | 1 | 0 | 1 | 0 | 0 | 0 | 0 | 0 | 1 | 1 |
| 22 | 1 | 0 | 0 | 0 | 1 | 0 | 0 | 1 | 1 | 0 | 1 |
| 23 | 1 | 1 | 1 | 0 | 1 | 0 | 0 | 0 | 1 | 1 | 1 |
| 24 | 1 | 1 | 1 | 1 | 1 | 0 | 1 | 1 | 1 | 1 | 0 |
| 25 | 1 | 1 | 0 | 0 | 0 | 1 | 1 | 1 | 0 | 0 | 1 |
| 26 | 1 | 0 | 1 | 1 | 0 | 1 | 0 | 0 | 1 | 1 | 0 |
| 27 | 1 | 1 | 1 | 1 | 0 | 1 | 0 | 1 | 1 | 1 | 0 |
| 28 | 1 | 0 | 1 | 0 | 1 | 1 | 0 | 1 | 0 | 0 | 0 |
| 29 | 1 | 0 | 1 | 1 | 1 | 1 | 1 | 1 | 1 | 0 | 0 |
| 30 | 1 | 1 | 1 | 1 | 1 | 1 | 1 | 1 | 1 | 1 | 1 |
| 31 | 1 | 0 | 0 | 0 | 0 | 0 | 0 | 0 | 0 | 0 | 0 |

FIG. 11

| # of info bits | 1 | 2 | 3 | 4 | 5 | 6 | 7 | 8 | 9 | 10 | 11 |
|---|---|---|---|---|---|---|---|---|---|---|---|
| min distance | 48 | 24 | 23 | 22 | 22 | 20 | 16 | 16 | 15 | 15 | 10 |

Table 6: Minimum distance of (48, O) code based on (32, O) code

FIG. 12

Table 7: Minimum distance of (48, O) code based on (32, O) code according to the offset starting value

| O / Offset | 1 | 2 | 3 | 4 | 5 | 6 | 7 | 8 | 9 | 10 | 11 |
|---|---|---|---|---|---|---|---|---|---|---|---|
| 0 | 48 | 24 | 23 | 22 | 22 | 20 | 16 | 16 | 15 | 15 | 10 |
| 1 | 48 | 24 | 24 | 22 | 22 | 21 | 16 | 15 | 15 | 15 | 11 |
| 2 | 48 | 23 | 23 | 22 | 22 | 21 | 15 | 15 | 15 | 15 | 12 |
| 3 | 48 | 24 | 23 | 22 | 21 | 21 | 15 | 15 | 15 | 15 | 12 |
| 4 | 48 | 24 | 22 | 22 | 22 | 22 | 15 | 15 | 15 | 15 | 12 |
| 5 | 48 | 23 | 22 | 21 | 21 | 21 | 15 | 15 | 15 | 15 | 13 |
| 6 | 48 | 23 | 22 | 20 | 20 | 20 | 15 | 15 | 15 | 15 | 13 |
| 7 | 48 | 23 | 21 | 21 | 21 | 21 | 15 | 15 | 15 | 15 | 12 |
| 8 | 48 | 24 | 22 | 21 | 21 | 21 | 16 | 15 | 15 | 14 | 12 |
| 9 | 48 | 24 | 23 | 22 | 21 | 21 | 15 | 15 | 15 | 15 | 12 |
| 10 | 48 | 23 | 22 | 22 | 21 | 21 | 15 | 15 | 15 | 14 | 13 |
| 11 | 48 | 23 | 22 | 22 | 21 | 21 | 15 | 15 | 15 | 14 | 12 |
| 12 | 48 | 23 | 22 | 22 | 21 | 21 | 15 | 15 | 15 | 13 | 12 |
| 13 | 48 | 23 | 23 | 22 | 21 | 20 | 16 | 15 | 15 | 14 | 12 |
| 14 | 48 | 24 | 24 | 23 | 22 | 20 | 16 | 15 | 15 | 14 | 12 |
| 15 | 48 | 23 | 23 | 23 | 22 | 20 | 16 | 15 | 15 | 14 | 12 |
| 16 | 48 | 24 | 23 | 22 | 22 | 20 | 16 | 16 | 16 | 15 | 12 |
| 17 | 48 | 24 | 24 | 22 | 22 | 21 | 16 | 16 | 15 | 14 | 12 |
| 18 | 48 | 23 | 23 | 22 | 22 | 21 | 16 | 16 | 15 | 15 | 13 |
| 19 | 48 | 24 | 23 | 22 | 21 | 21 | 16 | 16 | 14 | 14 | 12 |
| 20 | 48 | 24 | 22 | 22 | 22 | 22 | 15 | 15 | 15 | 15 | 12 |
| 21 | 48 | 23 | 22 | 21 | 21 | 21 | 16 | 16 | 14 | 14 | 12 |
| 22 | 48 | 23 | 22 | 20 | 20 | 20 | 16 | 16 | 15 | 15 | 12 |
| 23 | 48 | 23 | 21 | 21 | 21 | 21 | 15 | 15 | 15 | 15 | 12 |
| 24 | 48 | 24 | 22 | 21 | 21 | 21 | 15 | 15 | 15 | 15 | 13 |
| 25 | 48 | 24 | 23 | 22 | 21 | 21 | 15 | 15 | 15 | 15 | 12 |
| 26 | 48 | 23 | 22 | 22 | 21 | 21 | 15 | 15 | 15 | 15 | 12 |
| 27 | 48 | 23 | 22 | 22 | 21 | 21 | 15 | 15 | 15 | 15 | 12 |
| 28 | 48 | 23 | 22 | 22 | 21 | 21 | 15 | 15 | 15 | 14 | 12 |
| 29 | 48 | 23 | 23 | 22 | 21 | 20 | 15 | 15 | 15 | 14 | 12 |
| 30 | 48 | 24 | 24 | 23 | 22 | 20 | 15 | 15 | 15 | 14 | 11 |
| 31 | 48 | 23 | 23 | 23 | 22 | 20 | 15 | 15 | 15 | 15 | 11 |

FIG. 13

Table 8: Selected offset to produce maximum error correction capability in each O values

| O / Offset | 1 | 2 | 3 | 4 | 5 | 6 | 7 | 8 | 9 | 10 | 11 |
|---|---|---|---|---|---|---|---|---|---|---|---|
| 2 | 48 | 23 | 23 | 22 | 22 | 21 | 15 | 15 | 15 | 15 | 12 |
| 3 | 48 | 24 | 23 | 22 | 21 | 21 | 15 | 15 | 15 | 15 | 12 |
| 9 | 48 | 24 | 23 | 22 | 21 | 21 | 15 | 15 | 15 | 15 | 12 |
| 18 | 48 | 23 | 23 | 22 | 22 | 21 | 16 | 16 | 15 | 15 | 13 |
| 25 | 48 | 24 | 23 | 22 | 21 | 21 | 15 | 15 | 15 | 15 | 12 |

FIG. 14

Table 9: Selected offset to produce maximum error correction capability in each O values

| O / Offset | 1 | 2 | 3 | 4 | 5 | 6 | 7 | 8 | 9 | 10 |
|---|---|---|---|---|---|---|---|---|---|---|
| 1 | 48 | 24 | 24 | 22 | 22 | 21 | 16 | 15 | 15 | 15 |
| 2 | 48 | 23 | 23 | 22 | 22 | 21 | 15 | 15 | 15 | 15 |
| 3 | 48 | 24 | 23 | 22 | 21 | 21 | 15 | 15 | 15 | 15 |
| 9 | 48 | 24 | 23 | 22 | 21 | 21 | 15 | 15 | 15 | 15 |
| 18 | 48 | 23 | 23 | 22 | 22 | 21 | 16 | 16 | 15 | 15 |
| 25 | 48 | 24 | 23 | 22 | 21 | 21 | 15 | 15 | 15 | 15 |

FIG. 15

Table 10: Extended basis sequences for (32, O) code with O=1, 2, ..., 12

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ |
|---|---|---|---|---|---|---|---|---|---|---|---|---|
| 0 | 1 | 1 | 0 | 0 | 0 | 0 | 0 | 0 | 0 | 0 | 1 | 1 |
| 1 | 1 | 1 | 1 | 0 | 0 | 0 | 0 | 0 | 0 | 1 | 1 | 1 |
| 2 | 1 | 0 | 0 | 1 | 0 | 0 | 1 | 0 | 1 | 1 | 1 | 1 |
| 3 | 1 | 0 | 1 | 1 | 0 | 0 | 0 | 0 | 1 | 0 | 1 | 1 |
| 4 | 1 | 1 | 1 | 1 | 0 | 0 | 0 | 1 | 0 | 0 | 1 | 1 |
| 5 | 1 | 1 | 0 | 0 | 1 | 0 | 1 | 1 | 1 | 0 | 1 | 1 |
| 6 | 1 | 0 | 1 | 0 | 1 | 0 | 1 | 0 | 1 | 1 | 1 | 1 |
| 7 | 1 | 0 | 0 | 1 | 1 | 0 | 0 | 1 | 1 | 0 | 1 | 1 |
| 8 | 1 | 1 | 0 | 1 | 1 | 0 | 0 | 1 | 0 | 1 | 1 | 1 |
| 9 | 1 | 0 | 1 | 1 | 1 | 0 | 1 | 0 | 0 | 1 | 1 | 1 |
| 10 | 1 | 0 | 1 | 0 | 0 | 1 | 1 | 1 | 0 | 1 | 1 | 1 |
| 11 | 1 | 1 | 1 | 0 | 0 | 1 | 1 | 0 | 1 | 0 | 1 | 1 |
| 12 | 1 | 0 | 0 | 1 | 0 | 1 | 0 | 1 | 1 | 1 | 1 | 1 |
| 13 | 1 | 1 | 0 | 1 | 0 | 1 | 0 | 1 | 0 | 1 | 1 | 1 |
| 14 | 1 | 0 | 0 | 0 | 1 | 1 | 0 | 1 | 0 | 0 | 1 | 0 |
| 15 | 1 | 1 | 0 | 0 | 1 | 1 | 1 | 1 | 0 | 1 | 1 | 0 |
| 16 | 1 | 1 | 1 | 0 | 1 | 1 | 1 | 0 | 0 | 1 | 0 | 1 |
| 17 | 1 | 0 | 0 | 1 | 1 | 1 | 0 | 0 | 1 | 0 | 0 | 1 |
| 18 | 1 | 1 | 0 | 1 | 1 | 1 | 1 | 1 | 0 | 0 | 0 | 0 |
| 19 | 1 | 0 | 0 | 0 | 0 | 1 | 1 | 0 | 0 | 0 | 0 | 0 |
| 20 | 1 | 0 | 1 | 0 | 0 | 0 | 1 | 0 | 0 | 0 | 1 | 0 |
| 21 | 1 | 1 | 0 | 1 | 0 | 0 | 0 | 0 | 0 | 1 | 1 | 1 |
| 22 | 1 | 0 | 0 | 0 | 1 | 0 | 0 | 1 | 1 | 0 | 1 | 0 |
| 23 | 1 | 1 | 1 | 0 | 1 | 0 | 0 | 1 | 1 | 1 | 1 | 1 |
| 24 | 1 | 1 | 1 | 1 | 1 | 0 | 1 | 1 | 1 | 1 | 0 | 0 |
| 25 | 1 | 1 | 0 | 0 | 0 | 1 | 1 | 1 | 0 | 0 | 1 | 1 |
| 26 | 1 | 0 | 1 | 1 | 0 | 1 | 0 | 0 | 1 | 1 | 0 | 0 |
| 27 | 1 | 1 | 1 | 1 | 0 | 1 | 0 | 1 | 1 | 1 | 0 | 1 |
| 28 | 1 | 0 | 1 | 0 | 1 | 1 | 0 | 1 | 0 | 0 | 0 | 1 |
| 29 | 1 | 0 | 1 | 1 | 1 | 1 | 1 | 1 | 1 | 0 | 0 | 1 |
| 30 | 1 | 1 | 1 | 1 | 1 | 1 | 1 | 1 | 1 | 1 | 1 | 0 |
| 31 | 1 | 0 | 0 | 0 | 0 | 0 | 0 | 0 | 0 | 0 | 0 | 0 |

FIG. 16

Table 11: Minimum distance of (48, O) code based on (32, O) code

| # of info bits | 1 | 2 | 3 | 4 | 5 | 6 | 7 | 8 | 9 | 10 | 11 | 12 |
|---|---|---|---|---|---|---|---|---|---|---|---|---|
| min distance | 48 | 24 | 23 | 22 | 22 | 20 | 16 | 16 | 15 | 15 | 10 | 10 |

FIG. 17

Table 12: Minimum distance of (48, O) code based on (32, O) code according to the offset starting value

| O Offset | 1 | 2 | 3 | 4 | 5 | 6 | 7 | 8 | 9 | 10 | 11 | 12 |
|---|---|---|---|---|---|---|---|---|---|---|---|---|
| 0 | 48 | 24 | 23 | 22 | 22 | 20 | 16 | 16 | 15 | 15 | 10 | 10 |
| 1 | 48 | 24 | 24 | 22 | 22 | 21 | 16 | 15 | 15 | 15 | 11 | 11 |
| 2 | 48 | 23 | 23 | 22 | 22 | 21 | 15 | 15 | 15 | 15 | 12 | 12 |
| 3 | 48 | 24 | 23 | 22 | 21 | 21 | 15 | 15 | 15 | 15 | 12 | 12 |
| 4 | 48 | 24 | 22 | 22 | 22 | 22 | 15 | 15 | 15 | 15 | 12 | 12 |
| 5 | 48 | 23 | 22 | 21 | 21 | 21 | 15 | 15 | 15 | 15 | 13 | 11 |
| 6 | 48 | 23 | 22 | 20 | 20 | 20 | 15 | 15 | 15 | 15 | 13 | 12 |
| 7 | 48 | 23 | 21 | 21 | 21 | 21 | 15 | 15 | 15 | 15 | 12 | 12 |
| 8 | 48 | 24 | 22 | 21 | 21 | 21 | 16 | 15 | 15 | 14 | 12 | 12 |
| 9 | 48 | 24 | 23 | 22 | 21 | 21 | 15 | 15 | 15 | 15 | 12 | 12 |
| 10 | 48 | 23 | 22 | 22 | 21 | 21 | 15 | 15 | 15 | 14 | 13 | 12 |
| 11 | 48 | 23 | 22 | 22 | 21 | 21 | 15 | 15 | 15 | 14 | 12 | 12 |
| 12 | 48 | 23 | 22 | 22 | 21 | 21 | 15 | 15 | 15 | 13 | 12 | 11 |
| 13 | 48 | 23 | 23 | 22 | 21 | 20 | 16 | 15 | 15 | 14 | 12 | 11 |
| 14 | 48 | 24 | 24 | 23 | 22 | 20 | 16 | 15 | 15 | 14 | 12 | 11 |
| 15 | 48 | 23 | 23 | 23 | 22 | 20 | 16 | 15 | 15 | 14 | 12 | 11 |
| 16 | 48 | 24 | 23 | 22 | 22 | 20 | 16 | 16 | 16 | 15 | 12 | 12 |
| 17 | 48 | 24 | 24 | 22 | 22 | 21 | 16 | 16 | 15 | 14 | 12 | 12 |
| 18 | 48 | 23 | 23 | 22 | 22 | 21 | 16 | 16 | 15 | 15 | 13 | 12 |
| 19 | 48 | 24 | 23 | 22 | 21 | 21 | 16 | 16 | 14 | 14 | 12 | 12 |
| 20 | 48 | 24 | 22 | 22 | 22 | 22 | 15 | 15 | 15 | 15 | 12 | 12 |
| 21 | 48 | 23 | 22 | 21 | 21 | 21 | 16 | 16 | 14 | 14 | 12 | 11 |
| 22 | 48 | 23 | 22 | 20 | 20 | 20 | 16 | 16 | 15 | 15 | 12 | 11 |
| 23 | 48 | 23 | 21 | 21 | 21 | 21 | 15 | 15 | 15 | 15 | 12 | 12 |
| 24 | 48 | 24 | 22 | 21 | 21 | 21 | 15 | 15 | 15 | 15 | 13 | 12 |
| 25 | 48 | 24 | 23 | 22 | 21 | 21 | 15 | 15 | 15 | 15 | 12 | 12 |
| 26 | 48 | 23 | 22 | 22 | 21 | 21 | 15 | 15 | 15 | 15 | 12 | 11 |
| 27 | 48 | 23 | 22 | 22 | 21 | 21 | 15 | 15 | 15 | 15 | 12 | 11 |
| 28 | 48 | 23 | 22 | 22 | 21 | 21 | 15 | 15 | 15 | 14 | 12 | 12 |
| 29 | 48 | 23 | 23 | 22 | 21 | 20 | 15 | 15 | 15 | 14 | 12 | 12 |
| 30 | 48 | 24 | 24 | 23 | 22 | 20 | 15 | 15 | 15 | 14 | 11 | 11 |
| 31 | 48 | 23 | 23 | 23 | 22 | 20 | 15 | 15 | 15 | 15 | 11 | 11 |

FIG. 18

Table 13: Selected offset to produce maximum error correction capability in each O values

| Offset \ O | 1 | 2 | 3 | 4 | 5 | 6 | 7 | 8 | 9 | 10 | 11 | 12 |
|---|---|---|---|---|---|---|---|---|---|---|---|---|
| 2 | 48 | 23 | 23 | 22 | 22 | 21 | 15 | 15 | 15 | 15 | 12 | 12 |
| 3 | 48 | 24 | 23 | 22 | 21 | 21 | 15 | 15 | 15 | 15 | 12 | 12 |
| 9 | 48 | 24 | 23 | 22 | 21 | 21 | 15 | 15 | 15 | 15 | 12 | 12 |
| 18 | 48 | 23 | 23 | 22 | 22 | 21 | 16 | 16 | 15 | 15 | 13 | 12 |
| 25 | 48 | 24 | 23 | 22 | 21 | 21 | 15 | 15 | 15 | 15 | 12 | 12 |

ENHANCED BLOCK CODING METHOD BASED ON SMALL SIZE BLOCK CODE

CROSS-REFERENCE

The present disclosure claims priority benefit to the following applications, which contents are all incorporated by reference herein: U.S. Provisional Application No. 61/333,550 (filed May 11, 2010).

BACKGROUND

In the related art, certain procedures related to conventional block encoding methods were problematic due to complicated calculations and overall processing burden. As such, the related art technologies do not sufficiently address such issues, and thus do not offer appropriate solutions.

SUMMARY

The present inventors recognized at least the above-identified drawbacks of the related art. Based upon such recognition, the various features described hereafter have been conceived such that certain procedures related to block encoding are more efficiently and effectively performed. In particular, basis sequences for a (48, O) code are generated based on extended basis sequences for the (32, O) code with a particular offset starting value.

BRIEF DESCRIPTION OF THE DRAWINGS

FIG. 8 shows an exemplary table for the number of bits per number of ACK/NACKs including DTX (Table 3).

FIG. 9 shows another exemplary table for the number of bits per number of ACK/NACKs including DTX (Table 4).

FIG. 10 shows exemplary basis sequences for (32, O) code (Table 5).

FIG. 11 shows the minimum distances of (48, O) code based on (32, O) code (Table 6).

FIG. 12 shows the minimum distances of (48, V) code based on (32, O) code according to the offset starting value (Table 7).

FIG. 13 shows selected offsets to produce maximum error correction capability in each O value (Table 8).

FIG. 14 shows more selected offsets to produce maximum error correction capability in each O value (Table 9).

FIG. 15 shows the extended basis sequences for (32, O) code with O=1, 2, . . . , 12 (Table 10).

FIG. 16 shows examples of minimum distances of (48, O) code based on (32, O) code (Table 11).

FIG. 17 shows the minimum distances of (48, O) code based on (32, O) code according to the offset starting value (Table 12).

FIG. 18 shows selected offsets to produce maximum error correction capability in each O value (Table 13).

DETAILED DESCRIPTION

The inventive concepts and features described herein are generally explained in terms of 3GPP Long Term Evolution Advanced (LTE-A) employing multiple-input multiple-output (MIMO) technology. However, such details are not meant to limit the various features described herein, which are applicable to other types of mobile and/or wireless (radio) communication systems and methods that comply with various types of standards.

The present inventors recognized that conventional block encoding methods could be improved. It is important to note that such problem recognition was based upon concentrated investigation, rigorous simulations, and experimental testing conducted by the present inventors. As a result, the present inventors have provided a method of generating of basis sequences for a (48, O) code. In particular, the concept of generating basis sequences for a (48, O) code based on extended basis sequences for the (32, O) code with a particular offset starting value has never been provided or suggested in any known technique prior to the work done by the present inventors as described in this disclosure and in the priority document disclosures.

Embodiments of this invention propose the concept of generating basis sequences for a (48, O) code based on extended basis sequences for the (32, O) code with a particular offset starting value, wherein the offset starting value is selected as 18, which results in the largest sum of distances.

LTE Physical Layer Overview

The techniques, methods, apparatuses, and systems described herein can be used in various wireless access technologies such as code division multiple access (CDMA), frequency division multiple access (FDMA), time division multiple access (TDMA), orthogonal frequency division multiple access (OFDMA), single carrier frequency division multiple access (SC-FDMA), etc. CDMA may be implemented with a radio technology such as Universal Terrestrial Radio Access (UTRA) or CDMA2000. TDMA may be implemented with a radio technology such as Global System for Mobile communications (GSM)/General Packet Radio Service (GPRS)/Enhanced Data Rates for GSM Evolution (EDGE). OFDMA may be implemented with a radio technology such as institute of electrical and electronics engineers (IEEE) 802.11 (Wi-Fi), IEEE 802.16 (WiMAX), IEEE 802-20, evolved-UTRA (E-UTRA) etc. The UTRA is a part of a universal mobile telecommunication system (UMTS). The 3rd generation partnership project (3GPP) long term evolution (LTE) is a part of an evolved-UMTS (E-UMTS) using the E-UTRA. The 3GPP LTE employs the OFDMA in downlink and employs the SC-FDMA in uplink. LTE-advance (LTE-A) is an evolution of the 3GPP LTE. For clarity, this application focuses on the 3GPP LTE/LTE-A. However, technical features described herein are not limited thereto.

Figure 1:
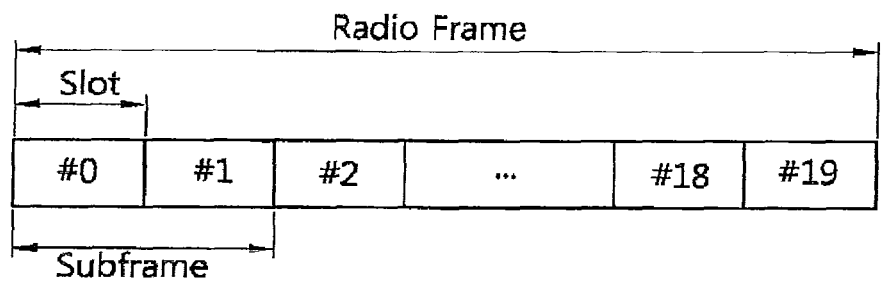
FIG. 1 shows an exemplary structure of a radio frame for 3GPP LTE technology.

FIG. 1 shows an exemplary structure of a radio frame of used in 3GPP LTE. In FIG. 1, a radio frame includes 10 subframes. A subframe includes two slots in time domain. A time duration or unit for transmitting one subframe is defined as a transmission time interval (TTI). For example, one subframe may have a length of 1 millisecond (ms), and one slot may have a length of 0.5 ms. One slot includes a plurality of orthogonal frequency division multiplexing (OFDM) symbols in the time domain. Since the 3GPP LTE uses the OFDMA in the downlink, the OFDM symbol is for representing one symbol period. The OFDM symbol may also be referred to as an SC-FDMA symbol or a symbol period. A resource block (RB) is a resource allocation unit, and includes a plurality of contiguous subcarriers in one slot. The structure of the radio frame is shown for exemplary purposes only. Thus, the number of subframes included in the radio frame or the number of slots included in the subframe or the number of OFDM symbols included in the slot may be modified in various manners.

Figure 2:
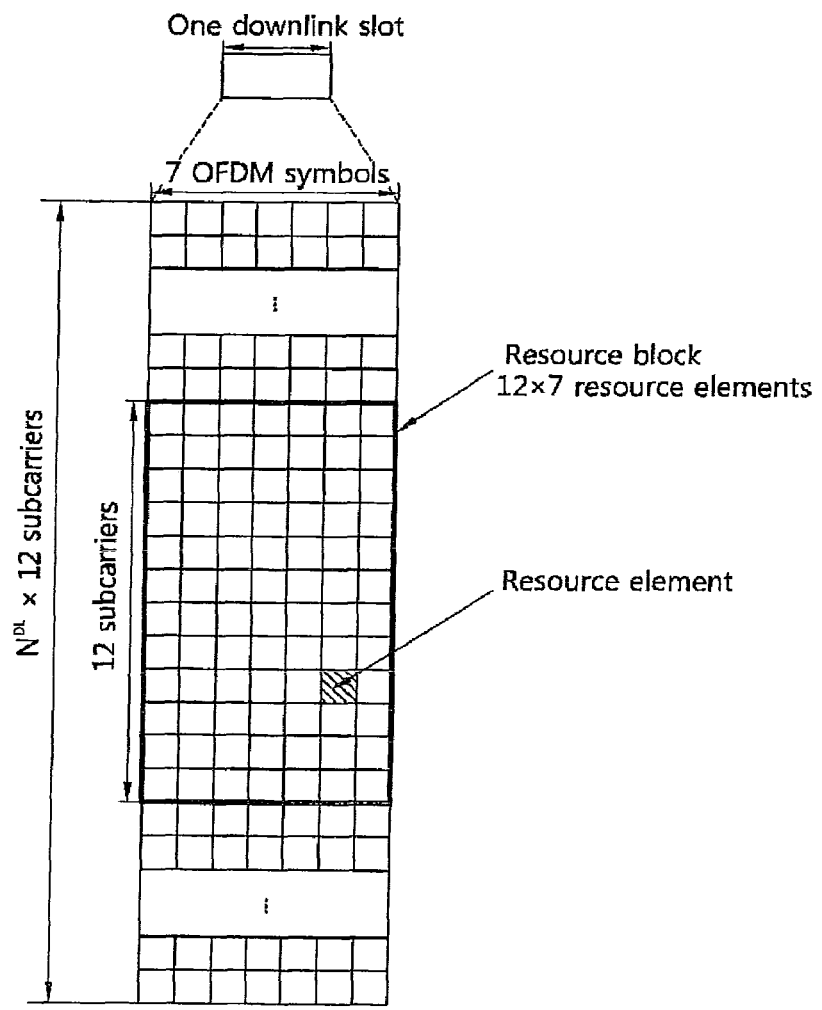
FIG. 2 shows an exemplary resource grid for one downlink slot.

FIG. 2 shows an exemplary resource grid for one downlink slot. In FIG. 2, a downlink slot includes a plurality of OFDM symbols in time domain. It is described herein that one downlink slot includes 7 OFDM symbols, and one resource block (RB) includes 12 subcarriers in frequency domain as an example. However, embodiments of the present invention are not limited thereto. Each element on the resource grid is referred to as a resource element. One RB includes 12×7 resource elements. The number NDL of RB's included in the downlink slot depends on a downlink transmit bandwidth. The structure of an uplink slot may be same as that of the downlink slot.

Figure 3:
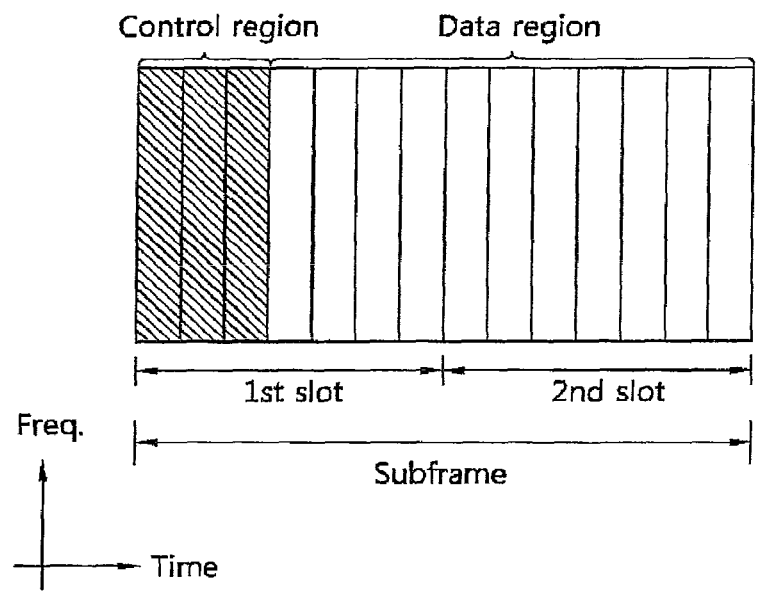
FIG. 3 shows an exemplary structure of a downlink subframe.

FIG. 3 shows an exemplary structure of a downlink subframe. In FIG. 3, a maximum of three OFDM symbols are located in a front portion of a 1st slot within a subframe correspond to a control region to be assigned with a control channel. The remaining OFDM symbols correspond to a data region to be assigned with a physical downlink shared chancel (PDSCH). Examples of downlink control channels used in the 3GPP LTE include a physical control format indicator channel (PCFICH), a physical downlink control channel (PDCCH), a physical hybrid ARQ indicator channel (PHICH), etc. The PCFICH is transmitted at a first OFDM symbol of a subframe and carries information regarding the number of OFDM symbols used for transmission of control channels within the subframe. The PHICH is a response of uplink transmission and carries an HARQ acknowledgment (ACK)/not-acknowledgment (NACK) signal. Control information transmitted through the PDCCH is referred to as downlink control information (DCI). The DCI includes uplink or downlink scheduling information or includes an uplink transmit (Tx) power control command for arbitrary UE (user equipment) groups.

The PDCCH may carry a transport format and a resource allocation of a downlink shared channel (DL-SCH), resource allocation information of an uplink shared channel (UL-SCH), paging information on a paging channel (PCH), system information on the DL-SCH, a resource allocation of an upper-layer control message such as a random access response transmitted on the PDSCH, a set of Tx power control commands on individual UEs within an arbitrary UE group, a Tx power control command, activation of a voice over IP (VoIP), etc. A plurality of PDCCHs can be transmitted within a control region. The UE can monitor the plurality of PDCCHs. The PDCCH is transmitted on an aggregation of one or several consecutive control channel elements (CCEs). The CCE is a logical allocation unit used to provide the PDCCH with a coding rate based on a state of a radio channel. The CCE corresponds to a plurality of resource element groups. A format of the PDCCH and the number of bits of the available PDCCH are determined according to a correlation between the number of CCEs and the coding rate provided by the CCEs. The BS (base station) determines a PDCCH format according to a DCI to be transmitted to the UE, and attaches a cyclic redundancy check (CRC) to control information. The CRC is masked with a unique identifier (referred to as a radio network temporary identifier (RNTI)) according to an owner or usage of the PDCCH. If the PDCCH is for a specific UE, a unique identifier (e.g., cell-RNTI (C-RNTI)) of the UE may be masked to the CRC. Alternatively, if the PDCCH is for a paging message, a paging indicator identifier (e.g., paging-RNTI (P-RNTI)) may be masked to the CRC. If the PDCCH is for system information (more specifically, a system information block (SIB) to be described below), a system information identifier and a system information RNTI (SI-RNTI) may be masked to the CRC. To indicate a random access response that is a response for transmission of a random access preamble of the UE, a random access-RNTI (RA-RNTI) may be masked to the CRC.

Figure 4:
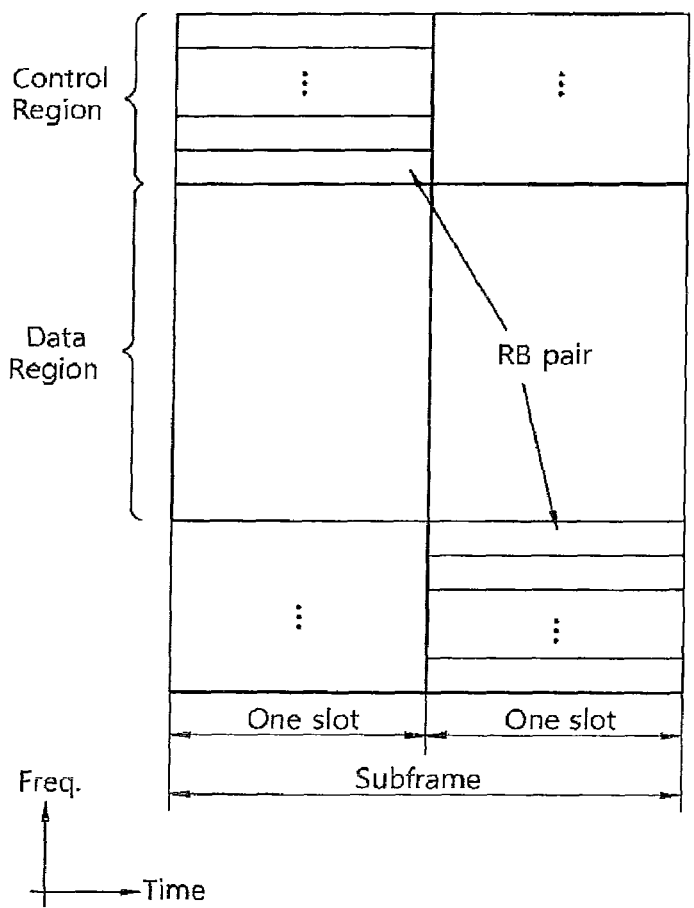
FIG. 4 shows an exemplary structure of an uplink subframe.

FIG. 4 shows an exemplary structure of an uplink frame. In FIG. 4, an uplink subframe can be divided in the frequency domain into a control region and a data region. The control region is allocated with a physical uplink control channel (PUCCH) for carrying uplink control information. The data region is allocated with a physical uplink shared channel (PUSCH) for carrying user data. To maintain a single carrier property, one UE does not simultaneously transmit the PUCCH and the PUSCH. The PUCCH for one UE is allocated to an RB (radio bearer) pair in a subframe. RBs belonging to the RB pair occupy different subcarriers in respective two slots. In other words, it can be said that the RB pair allocated to the PUCCH is frequency-hopped in a slot boundary.

Figures 5, 6, 7:
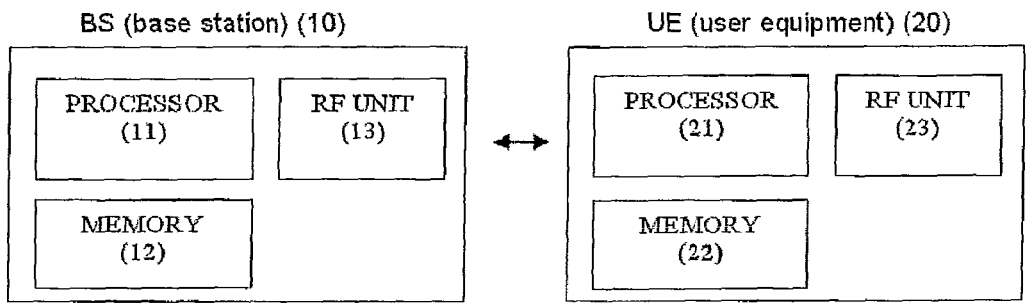
FIG. 5 shows an exemplary system for implementing certain embodiments of the invention.
FIG. 6 shows an exemplary table for the number of bits per number of ACK/NACKs (Table 1).
FIG. 7 shows another exemplary table for the number of bits per number of ACK/NACKs (Table 2).

FIG. 5 shows an exemplary system for implementing the embodiments described herein. In FIG. 5, a wireless communication system includes a BS (base station) 10 and one or more UE (user equipment) 20. In the downlink, a transmitter may be a part of the BS 10, and a receiver may be a part of the UE 20. In the uplink, a transmitter may be a part of the UE 20, and a receiver may be a part of the BS 10. A BS 10 may include a processor 11, a memory 12, and a radio frequency (RF) unit 13. The processor 11 may be configured to implement the proposed procedures and/or methods described herein. The memory 12 is coupled with the processor 11 and stores a variety of information for the processor 11. The RF unit 13 is coupled with the processor 11 and transmits and/or receives radio (wireless) signals. A UE 20 may include a processor 21, a memory 22, and a RF unit 23. The processor 21 may be configured to implement the proposed procedures and/or methods described herein. The memory 22 is coupled with the processor 21 and stores a variety of information for the processor 21. The RF unit 23 is coupled with the processor 21 and transmits and/or receives radio (wireless) signals. The BS 10 and/or the UE 20 may have single antenna or multiple antennas. When at least one of the BS 10 and the UE 20 has multiple antennas, the wireless communication system may be referred to as multiple input multiple output (MIMO) system.

Hereafter, the fundamentals of error correcting code will be explained. Generally, the binary error correction code is denoted by [n, k, d] where n is a number of bits in a codeword, k is a number of bits in data input and d is a minimum distance between arbitrarily selected two codewords. All the notations assume to be binary, the number of all possible points in codeword space is $2^n$ and the number of encoded codewords is $2^k$. In short, the notation could be simplified into [n, k] or (n, k) dropping the minimum distance part. Hereinafter, n, k and d will have aforementioned meanings respectively, otherwise specified. The code rate R is defined as a ratio of a number of information bits to a number of coded bits, i.e. R=k/n.

The Hamming distance is defined as a number of different bits between two codewords and used to measure the performance of a code. For instance, two codewords of 101011 and 110010 result in a Hamming distance 3. The Hamming distance could be a direct measure of error correction capability since a code with Hamming distance d≥2t+1 has a capability to correct up to t errors. The Hamming distance is sometimes called just distance for convenience. The exact equation showing the relation between an error correction capability t and a Hamming distance d of a code is like in Equation 1 below:

$$t = \left\lfloor \frac{d-1}{2} \right\rfloor \quad \text{[Equation 1]}$$

The minimum distance is a minimum among distances measured between all combinations of two codewords. The minimum distance is one of key criteria to indicate the degree to which a codeword is good. Among various distances, the Hamming distance is widely used to decide the minimum distance; a so called minimum Hamming distance. Hereinafter, the minimum distance will be used to indicate a minimum Hamming distance otherwise specified. Intuitively, if two codewords are located far away to produce large minimum distance, one codeword is much less likely to be decided as another codeword. In addition, the performance of a system is usually governed by the case of worst performance. Therefore, it can be concluded that the performance of a code is determined by a minimum distance among codewords. That is to say, to design a good code is equivalent to maximizing the minimum distance of a codeword.

Due to the increasing demand of high rate transmission over the air, LTE (Long Term Evolution) has been evolved further into LTE-A (LTE Advanced). In order to accommodate wider bandwidth while maintaining compatibility to LTE as much as possible, LTE-A has adopted the carrier aggregation techniques to support up to 100 MHz. Since the bandwidth of LTE can span up to 20 MHz, there can be up to 5 aggregated carriers in LTE-A at most. The aggregation carriers do not necessarily have to be consecutive; its configuration may have wide range of variations. In addition, HARQ techniques, which have been widely used since 3 G communication systems (such as WCDMA), are also applied in each aggregated carrier. Each aggregated carrier will inevitably have one ACK/NACK to enable HARQ to operate in the carrier. One ACK/NACK has either of two states, and thus the ACK/NACKs can be represented by one bit. Therefore, the number of ACK/NACKs for LTE-A can be up to 5, which support up to 5 aggregated carriers. For example, ACK/NACK up to 5 aggregated carries can be represented as Table 1 in FIG. 6.

The increasing demand of high data rate may be resolved by other methods than bandwidth expansion, such as MIMO. MIMO can create virtual addition dimension or stream in space domain, which results in the increase of data transmission rate. The number of streams that can be virtually created by MIMO is limited to the number of transmission antennas. For example, a MIMO system with 4 transmission antennas can produce up to 4 streams. MIMO can increase the transmission rate using the increased streams so that it may increase the number of ACK/NACK. However, the number of ACK/NACKs is decided by the number of the codewords transmitted through the MIMO system. Here, the number of codewords can be different than the number of streams. For example, LTE has up to 2 codewords even if the number of streams can be extended up to 4, by using 4 transmission antennas; LTE has 2 ACK/NACKs for 2 codewords while 1 ACK/NACK for 1 codeword. If the number of codewords in LTE-A is assumed to be 2, the same as that of LTE, then LTE-A has up to 2 ACK/NACKs per each carrier. The 2 ACK/NACKs has 4 states, namely, (ACK,ACK), (ACK, NACK), (NACK,ACK) or (NACK,NACK), in which the 1st ACK/NACK in parentheses corresponds to the ACK/NACK of 1st codeword, and the 2nd ACK/NACK to the 2nd codeword, respectively; and thus the 2 ACK/NACKs can be represented by 2 bits. Taking into consideration the carrier aggregation, the number of ACK/NACKs of MIMO in LTE-A can be represented as Table 2 in FIG. 7.

The aggregation of carriers can be done in a non-continuous manner; for example, among 5 candidate carriers, 3 carriers could be aggregated using the 1st, 2nd and 5th carriers. On top of that, even though some number of carriers may be set to be aggregated, the actual number of carriers may be less than such set number. For instance, even if 3 carriers are aggregated in the system, the actual number of used carriers could be 1 or 2. If the number of carriers used at a time is lower than the maximum number of aggregated carriers, some carriers are not be used at a given time, it may be beneficial to report which carriers are not used. To indicate the carriers that are not used temporarily, the DTX (discontinuous transmission) mark can be considered in the feedback. A DTX can be incorporated into ACK/NACK transmission scheme such that a DTX can confirm the corresponding carrier is not used at given time. Since DTX and ACK/NACK are mutually exclusive, if the DTX indication is introduced in ACK/NACK transmission, the number of states of ACK/NACK is increased by one.

Therefore, in non-MIMO mode (such as SISO: single-input single-output), the number of ACK/NACK states increase from 2 to 3 as per Table 3 shown in FIG. 8. In FIG. 8 (Table 3), it can be understood that the required number of bits is also enlarged to accommodate the increased states. In this disclosure, it is assumed the DTX transmission is incorporated into the ACK/NACK channel(s). Hereinafter, an ACK/NACK that includes a discontinuous transmission (DTX) can be simply denoted by ACK/NACK.

If DTX is introduced in MIMO mode with 2 codewords, the number of states of ACK/NACK will increase from 4 to 5 as per Table 4 in FIG. 9.

The payload size of ACK/NACK has a wide variety of range from 1 to 10 or from 1 to 12 depending on the inclusion of the DTX case. One of the promising candidates to transfer ACK/NACKs is the PUCCH which can transmit up to 20 bits. Since the size of ACK/NACK increases greatly compared to earlier specifications, the current PUCCH may not be appropriate to accommodate the increased ACK/NACKs. One of the candidates for new a PUCCH format is to support up to 48 bits for transmission. Hereinafter, the enhanced design of a (48, k) code, where k varies from 1 to 12, will be discussed. In particular, the (48, k) code based on a (32, O) code will be explained.

In LTE, there is a block code with coded bit length 32 and varying information length m from 1 to 11. The information bits input to the channel coding block are denoted by $o_0, o_1, o_2, o_3, \ldots o_{O-1}$ where O is the number of information bits. The information is first coded using a (32, O) block code. The code words of the (32, O) block code are a linear combination of the 11 basis sequences denoted $M_{i,n}$ and defined in Table 5 (=FIG. 10):

The encoded codeword is denoted by $b_0, b_1, b_2, b_3, \ldots, b_{B-1}$ where B=32 and decoded by Equation 2 below:

$$b_i = \sum_{n=0}^{O-1} (o_n \cdot M_{i,n}) \bmod 2 \quad \text{[Equation 2]}$$

where $i = 0, 1, 2, \ldots, B-1$.

The output bit sequence $q_0, q_1, q_2, q_3, \ldots, q_{Q-1}$ is obtained by circular repetition of the encoded block as following Equation 3:

$$q_i = b_{(i \bmod B)} \text{ where } i=0,1,2,\ldots,Q-1 \quad \text{[Equation 3]}$$

In this description, it is assumed that the length of rate matched sequence (Q) is 48. Encoding and rate matching method based on Table 5 and Equation 3 gives the following minimum distance property as in Table 6 (=FIG. 11).

The (32, O) code is circularly repeated to produce (48, O) code. In order to enhance the performance of (48, O) code, the starting offset value can be considered in Equation 3 to give the modified rate matching formula as in Equation 4.

$$q_i = b_{((i+\text{offset}) \bmod B)} \text{ where } i=0,1,2,\ldots,Q-1. \quad \text{[Equation 4]}$$

The performance of (48, O) code based on Table 5 and Equation 4 with various offset values is evaluated and summarized in Table 7 (=FIG. 12).

From Table 7, it can be understood that the performance varies according to the offset values. If the maximum distance is an even number, the next maximum distance with an odd number brings the same error correction capability based on Equation 1. For instance, if O is assumed to be 3, then its maximum distance is 24 with offset 1, 14, 17 or 30 which gives the 11 error correction capability, while the next minimum distance 23 also gives the same 11 error correction capability with offset 0, 2, 3, 9, 13, 15, 16, 18, 19, 25 or 29 as shown in Equation 5.

$$t = 11 = \left\lfloor \frac{24-1}{2} \right\rfloor = \left\lfloor \frac{23-1}{2} \right\rfloor \quad \text{[Equation 5]}$$

In order to choose the good offset value, the offset values which give the maximum error correction capability are sorted out as in Table 8 (=FIG. 13). For example, the offset value 1 is not selected since at O=11 it gives the minimum distance 10, the error correction capability 4 while the maximum minimum distance 13 at offset 18 which gives the error correction capability 6.

Among the offset values in Table 8, the largest sum of distances is achieved when the offset is 18. Therefore, it is proposed to use offset value 18 for the code (48, O) with O=1, 2, . . . , 11.

[Proposal 1] Best code (48, O) code based on Table 5 and Equation 4 with offset 18 where O=1, 2, . . . , 11.

On the other hand, the design interest would be limited to the 10 number of input bits if the DTX is not considered. Then the offset selection in (48, O) code with O=1, 2, . . . , 10 would be different even though the selection criterion is not changed as in Table 9 (=FIG. 14).

Among the offset values in Table 9, the largest sum of distances is achieved when the offset is 1. Therefore, it is proposed to use offset value 1 for the code (48, O) with O=1, 2, . . . , 10.

[Proposal 2] Best code (48, O) code based on Table 5 and Equation 4 with offset 1 where O=1, 2, . . . , 10.

If both MIMO and DTX are considered at the same time, the payload size soars up to 12 bits which can not be supported by Table 5. In order to support up to 12 bits, another basis sequence should be attached to the last column in Table 5. The evaluated and computer searched sequence, Mi,11, is shown in Table 10 (=FIG. 15). Except for the one more newly attached basis sequence, all the other aspects like the encoding method and rate matching method are the same as those based on Table 5 and either Equation 3 or Equation 4.

The encoding and rate matching method based on Table 10 and Equation 3 gives the following minimum distance properties as shown in Table 11 (=FIG. 16). It can be observed that the performance at O=12 is kept as that of O=11. Therefore, it is proposed to encode (32, O) code to support up to O=12.

[Proposal 3] (32, O) code based on Table 10 and Equation 3 with offset 1 where O=1, 2, . . . , 12.

The performance of (48, O) code based on Table 10 and Equation 4 with various offset values is evaluated and summarized in Table 12 (=FIG. 17).

In order to choose an appropriate offset value, the offset values which give the maximum error correction capability are sorted out as in Table 13 (=FIG. 18).

Among the offset values in Table 13, the largest sum of distances is achieved when the offset is 18. Therefore, it is proposed to use offset value 18 for the code (48, O) with O=1, 2, . . . , 12.

[Proposal 4] Best code (48, O) code based on Table 10 and Equation 4 with offset 18 where O=1, 2, . . . , 12.

Figure 19:
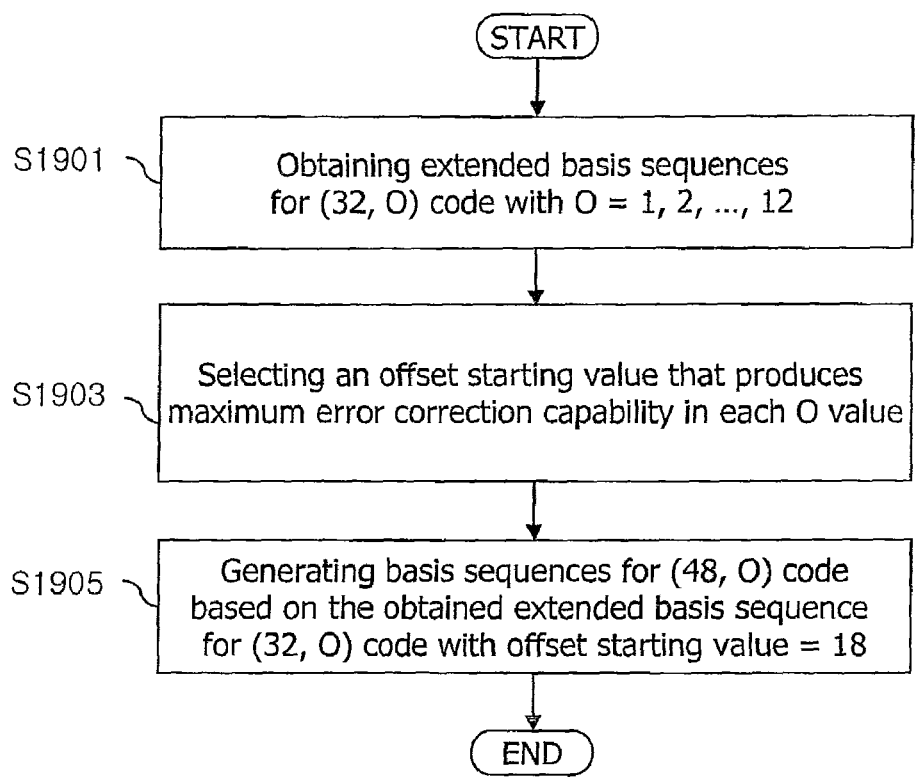
FIG. 19 shows an exemplary flowchart related to generating basis sequences for a (48, O) code based on the obtained extended basis sequences for the (32, O) code with the offset starting value.

To sum up, the various inventive concepts and features of the present disclosure can be described in the following manner:

Referring to FIG. 19, the present disclosure provides a scheme of enhanced block coding based on small size block code, which can be achieved by obtaining (S1901) extended basis sequences for a (32, O) code with O=1, 2, . . . 12; selecting (S1903) an offset starting value that produces maximum error correction capability in each O value; and generating (S1905) basis sequences for a (48, O) code based on the obtained extended basis sequences for the (32, O) code with the offset starting value selected based on the selecting step.

Also, the offset starting value is selected as 18, which results in the largest sum of distances. The step of obtaining the extended basis sequences for the (32, O) code with O=1, 2, . . . 12 includes the use of discontinuous transmission (DTX) techniques. The codewords of the (32, O) code are a linear combination of the selected O basis sequences among eleven basis sequences denoted as Mi,n and defined in Table 5 (=FIG. 10). The (32, O) code is circularly repeated to produce the (48, O) code by using the offset starting value in a modified rate matching formula of: $q_i = b_{((i+\text{offset}) \bmod B)}$ where i=0, 1, 2, . . . , Q−1 with Q=48. As a result, the extended basis sequences for the (32, O) code are defined in Table 10 (=FIG. 15).

The present disclosure also provides an apparatus having a radio frequency unit configured to send and receive signals and information; a memory configured to store data based on the signals and information sent and received via the radio frequency unit; and a processor configured to cooperate with the radio frequency unit and the memory in order to, obtain extended basis sequences for (32, O) code with O=1, 2, . . . 12; select an offset starting value that produces maximum error correction capability in each O value; and generate basis sequences for (48, O) code based on the obtained extended basis sequences for (32, O) code with the offset starting value selected based on the selecting step.

Also, referring back to FIG. 5, the present disclosure also provides an apparatus (e.g., device having appropriate hardware components such as a processing unit, controller, CPU, microprocessor(s), memory or storage, etc. that access and execute corresponding software code) that is able to implement and carry out the above-described method.

The various features and concepts described herein may be implemented in software, hardware, or a combination thereof. For example, a computer program (that is executed by a processor, controller, CPU, etc. in a computer, a mobile terminal and/or a network device) that implements a method and apparatus for the generating of basis sequences for a (48, O) code based on extended basis sequences for the (32, O) code with a particular offset starting value may be comprised of one or more program code sections or modules for performing various tasks. Similarly, a software tool (that is executed by a processor, controller, CPU, etc. in a computer, a mobile terminal and/or a network device) for a method and apparatus for the generating of basis sequences for a (48, O) code based on extended basis sequences for the (32, O) code with a particular offset starting value may comprise program code sections or modules that are executed by a processor (or other controller such as a CPU) for performing various tasks.

The method and apparatus for the generating of basis sequences for a (48, O) code based on extended basis sequences for the (32, O) code with a particular offset starling value are compatible with various types of technologies and standards. Certain concepts described herein are related to particular standards, such as 3GPP (LTE, LTE-Advanced, etc.), IEEE, 4G, GSM, WCDMA, and the like. However, it can be understood that the above exemplary standards are not intended to be limited, as other related standards and technologies would also be applicable to the various features and concepts described herein.

INDUSTRIAL APPLICABILITY

The features and concepts herein are applicable to and can be implemented in various types of user devices (e.g., mobile terminals, handsets, wireless communication devices, etc.) and/or network devices, entities, components, etc. that can be configured to support the generating of basis sequences for a (48, O) code based on extended basis sequences for the (32, O) code with a particular offset starting value.

As the various concepts and features described herein may be embodied in several forms without departing from the characteristics thereof, it should also be understood that the above-described embodiments are not limited by any of the details of the foregoing description, unless otherwise specified, but rather should be construed broadly within its scope as defined in the appended claims. Therefore, all changes and modifications that fall within such scope or equivalents thereof are therefore intended to be embraced by the appended claims.

What is claimed is:

1. A method of generating a codeword for transmitting an uplink signal by a mobile terminal in wireless communication system, the method comprising:

obtaining extended basis sequences for a (32, O) code, wherein the O=1, 2, . . . 12;

generating basis sequences for a plurality of (48, O) codes by circularly repeating the obtained extended basis sequences for the (32, O) code with a plurality of offset starting values, where the plurality of offset starting values are used for the circularly repeating the obtained extended basis sequences;

measuring error correction capabilities of each of the generated basis sequences for the plurality of (48, O); and selecting an offset starting value among the plurality of offset starting values which generates basis sequences for a (48,0) code having maximum error correction capability.

2. The method of claim 1, wherein the selected offset starting value is 18.

3. The method of claim 1, wherein the step of obtaining the extended basis sequences for the (32, O) code with O=1, 2, . . . 12 includes the use of discontinuous transmission (DTX) techniques.

4. The method of claim 1, wherein codewords of the (32, O) code are a linear combination of the selected O basis sequences among eleven basis sequences denoted as $M_{i,n}$ and defined to be:

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ |
|---|---|---|---|---|---|---|---|---|---|---|---|
| 0 | 1 | 1 | 0 | 0 | 0 | 0 | 0 | 0 | 0 | 0 | 1 |
| 1 | 1 | 1 | 1 | 0 | 0 | 0 | 0 | 0 | 0 | 1 | 1 |
| 2 | 1 | 0 | 0 | 1 | 0 | 0 | 1 | 0 | 1 | 1 | 1 |
| 3 | 1 | 0 | 1 | 1 | 0 | 0 | 0 | 0 | 1 | 0 | 1 |
| 4 | 1 | 1 | 1 | 1 | 0 | 0 | 0 | 1 | 0 | 0 | 1 |
| 5 | 1 | 1 | 0 | 0 | 1 | 0 | 1 | 1 | 1 | 0 | 1 |
| 6 | 1 | 0 | 1 | 0 | 1 | 0 | 1 | 0 | 1 | 1 | 1 |
| 7 | 1 | 0 | 0 | 1 | 1 | 0 | 0 | 1 | 1 | 0 | 1 |
| 8 | 1 | 1 | 0 | 1 | 1 | 0 | 0 | 1 | 0 | 1 | 1 |
| 9 | 1 | 0 | 1 | 1 | 1 | 0 | 1 | 0 | 0 | 1 | 1 |
| 10 | 1 | 0 | 1 | 0 | 0 | 1 | 1 | 1 | 0 | 1 | 1 |
| 11 | 1 | 1 | 1 | 0 | 0 | 1 | 1 | 0 | 1 | 0 | 1 |
| 12 | 1 | 0 | 0 | 1 | 0 | 1 | 0 | 1 | 1 | 1 | 1 |
| 13 | 1 | 1 | 0 | 1 | 0 | 1 | 0 | 1 | 0 | 1 | 1 |
| 14 | 1 | 0 | 0 | 0 | 1 | 1 | 0 | 1 | 0 | 0 | 1 |
| 15 | 1 | 1 | 0 | 0 | 1 | 1 | 1 | 1 | 0 | 1 | 1 |
| 16 | 1 | 1 | 1 | 0 | 1 | 1 | 1 | 0 | 0 | 1 | 0 |
| 17 | 1 | 0 | 0 | 1 | 1 | 1 | 0 | 0 | 1 | 0 | 0 |
| 18 | 1 | 1 | 0 | 1 | 1 | 1 | 1 | 1 | 0 | 0 | 0 |
| 19 | 1 | 0 | 0 | 0 | 0 | 1 | 1 | 0 | 0 | 0 | 0 |
| 20 | 1 | 0 | 1 | 0 | 0 | 0 | 1 | 0 | 0 | 0 | 1 |
| 21 | 1 | 1 | 0 | 1 | 0 | 0 | 0 | 0 | 0 | 1 | 1 |
| 22 | 1 | 0 | 0 | 0 | 1 | 0 | 0 | 1 | 1 | 0 | 1 |
| 23 | 1 | 1 | 1 | 0 | 1 | 0 | 0 | 0 | 1 | 1 | 1 |
| 24 | 1 | 1 | 1 | 1 | 1 | 0 | 1 | 1 | 1 | 1 | 0 |

-continued

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ |
|---|---|---|---|---|---|---|---|---|---|---|---|
| 25 | 1 | 1 | 0 | 0 | 0 | 1 | 1 | 1 | 0 | 0 | 1 |
| 26 | 1 | 0 | 1 | 1 | 0 | 1 | 0 | 0 | 1 | 1 | 0 |
| 27 | 1 | 1 | 1 | 1 | 0 | 1 | 0 | 1 | 1 | 1 | 0 |
| 28 | 1 | 0 | 1 | 0 | 1 | 1 | 1 | 0 | 1 | 0 | 0 |
| 29 | 1 | 0 | 1 | 1 | 1 | 1 | 1 | 1 | 1 | 0 | 0 |
| 30 | 1 | 1 | 1 | 1 | 1 | 1 | 1 | 1 | 1 | 1 | 1 |
| 31 | 1 | 0 | 0 | 0 | 0 | 0 | 0 | 0 | 0 | 0 | 0. |

5. The method of claim 4, wherein the (32, O) code is circularly repeated to produce the (48, O) code by using the offset starting value in a modified rate matching formula of: $q_i = b_{((i+\text{offset}) \bmod B)}$ where i=0, 1, 2, . . . , Q−1 with Q=48.

6. The method of claim 1, wherein the extended basis sequences for the (32, O) code is:

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ |
|---|---|---|---|---|---|---|---|---|---|---|---|---|
| 0 | 1 | 1 | 0 | 0 | 0 | 0 | 0 | 0 | 0 | 0 | 1 | 1 |
| 1 | 1 | 1 | 1 | 0 | 0 | 0 | 0 | 0 | 1 | 1 | 1 | 1 |
| 2 | 1 | 0 | 0 | 1 | 0 | 0 | 1 | 0 | 1 | 1 | 1 | 1 |
| 3 | 1 | 0 | 1 | 1 | 0 | 0 | 0 | 0 | 1 | 0 | 1 | 1 |
| 4 | 1 | 1 | 1 | 1 | 0 | 0 | 0 | 1 | 0 | 0 | 1 | 1 |
| 5 | 1 | 1 | 0 | 0 | 1 | 0 | 1 | 1 | 1 | 0 | 1 | 1 |
| 6 | 1 | 0 | 1 | 0 | 1 | 0 | 1 | 0 | 1 | 1 | 1 | 1 |
| 7 | 1 | 0 | 0 | 1 | 1 | 0 | 0 | 1 | 1 | 0 | 1 | 1 |
| 8 | 1 | 1 | 0 | 1 | 1 | 0 | 0 | 1 | 0 | 1 | 1 | 1 |
| 9 | 1 | 0 | 1 | 1 | 1 | 0 | 1 | 0 | 0 | 1 | 1 | 1 |
| 10 | 1 | 0 | 0 | 1 | 0 | 1 | 1 | 1 | 0 | 1 | 1 | 1 |
| 11 | 1 | 1 | 1 | 0 | 0 | 1 | 1 | 0 | 1 | 0 | 1 | 1 |
| 12 | 1 | 0 | 0 | 1 | 0 | 1 | 0 | 1 | 1 | 1 | 1 | 1 |
| 13 | 1 | 1 | 0 | 1 | 0 | 1 | 0 | 1 | 0 | 1 | 1 | 1 |
| 14 | 1 | 0 | 0 | 0 | 1 | 1 | 0 | 1 | 0 | 0 | 1 | 0 |
| 15 | 1 | 1 | 0 | 0 | 1 | 1 | 1 | 1 | 0 | 1 | 1 | 0 |
| 16 | 1 | 1 | 1 | 0 | 1 | 1 | 1 | 0 | 0 | 1 | 0 | 1 |
| 17 | 1 | 0 | 0 | 1 | 1 | 1 | 0 | 0 | 1 | 0 | 0 | 1 |
| 18 | 1 | 1 | 0 | 1 | 1 | 1 | 1 | 1 | 0 | 0 | 0 | 0 |
| 19 | 1 | 0 | 0 | 0 | 0 | 1 | 1 | 0 | 0 | 0 | 0 | 0 |
| 20 | 1 | 0 | 1 | 0 | 0 | 0 | 1 | 0 | 0 | 0 | 1 | 0 |
| 21 | 1 | 1 | 0 | 1 | 0 | 0 | 0 | 0 | 0 | 1 | 1 | 1 |
| 22 | 1 | 0 | 0 | 0 | 1 | 0 | 0 | 1 | 1 | 0 | 1 | 0 |
| 23 | 1 | 1 | 1 | 0 | 1 | 0 | 0 | 0 | 1 | 1 | 1 | 1 |
| 24 | 1 | 1 | 1 | 1 | 1 | 0 | 1 | 1 | 1 | 1 | 0 | 0 |
| 25 | 1 | 1 | 0 | 0 | 0 | 1 | 1 | 1 | 0 | 0 | 1 | 1 |
| 26 | 1 | 0 | 0 | 1 | 1 | 0 | 0 | 0 | 1 | 1 | 0 | 0 |
| 27 | 1 | 1 | 1 | 1 | 0 | 1 | 0 | 1 | 1 | 1 | 0 | 1 |
| 28 | 1 | 0 | 1 | 0 | 1 | 1 | 1 | 0 | 1 | 0 | 0 | 1 |
| 29 | 1 | 0 | 1 | 1 | 1 | 1 | 1 | 1 | 1 | 0 | 0 | 1 |
| 30 | 1 | 1 | 1 | 1 | 1 | 1 | 1 | 1 | 1 | 1 | 1 | 0 |
| 31 | 1 | 0 | 0 | 0 | 0 | 0 | 0 | 0 | 0 | 0 | 0 | 0. |

7. An apparatus comprising:
a radio frequency unit configured to send and receive signals and information;
a memory configured to store data based on the signals and information sent and received via the radio frequency unit; and
a processor configured to cooperate with the radio frequency unit and the memory in order to,
obtain extended basis sequences for (32, O) code, wherein the O=1, 2, . . . 12;
generate basis sequences for a plurality of (48, O) codes by circularly repeating the obtained extended basis sequences for (32, O) code with a plurality of offset starting values, where the plurality of offset starting values are used for the circularly repeating the obtained extended basis sequences;
measure error correction capabilities of each of the generated plurality of basis sequences for the (48, O) code; and
select an offset starting value among the plurality of offset starting values which generates basis sequences for the (48, O) code having maximum error correction capability.

8. The apparatus of claim 7, wherein the selected offset starting value is 18.

9. The apparatus of claim 7, wherein the step of obtaining the extended basis sequences for the (32, O) code with O=1, 2, . . . 12 includes the use of discontinuous transmission (DTX) techniques.

10. The apparatus of claim 7, wherein codewords of the (32, O) code are a linear combination of the selected O basis sequences among eleven basis sequences denoted as Mi,n and defined to be:

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ |
|---|---|---|---|---|---|---|---|---|---|---|---|
| 0 | 1 | 1 | 0 | 0 | 0 | 0 | 0 | 0 | 0 | 0 | 1 |
| 1 | 1 | 1 | 1 | 0 | 0 | 0 | 0 | 0 | 0 | 1 | 1 |
| 2 | 1 | 0 | 0 | 1 | 0 | 0 | 1 | 0 | 1 | 1 | 1 |
| 3 | 1 | 0 | 1 | 1 | 0 | 0 | 0 | 0 | 1 | 0 | 1 |
| 4 | 1 | 1 | 1 | 1 | 0 | 0 | 0 | 1 | 0 | 0 | 1 |
| 5 | 1 | 1 | 0 | 0 | 0 | 1 | 1 | 1 | 1 | 0 | 1 |
| 6 | 1 | 0 | 1 | 0 | 1 | 0 | 1 | 0 | 1 | 1 | 1 |
| 7 | 1 | 0 | 0 | 1 | 1 | 0 | 0 | 1 | 1 | 0 | 1 |
| 8 | 1 | 1 | 0 | 1 | 1 | 0 | 0 | 1 | 0 | 1 | 1 |
| 9 | 1 | 0 | 1 | 1 | 1 | 0 | 1 | 0 | 0 | 1 | 1 |
| 10 | 1 | 0 | 1 | 0 | 0 | 1 | 1 | 1 | 0 | 1 | 1 |
| 11 | 1 | 1 | 1 | 0 | 0 | 1 | 1 | 0 | 1 | 0 | 1 |
| 12 | 1 | 0 | 0 | 1 | 0 | 1 | 0 | 1 | 1 | 1 | 1 |
| 13 | 1 | 1 | 0 | 1 | 0 | 1 | 0 | 1 | 0 | 1 | 1 |
| 14 | 1 | 0 | 0 | 0 | 1 | 1 | 0 | 1 | 0 | 0 | 1 |
| 15 | 1 | 1 | 0 | 0 | 1 | 1 | 1 | 1 | 0 | 1 | 1 |
| 16 | 1 | 1 | 1 | 0 | 1 | 1 | 1 | 0 | 0 | 1 | 0 |
| 17 | 1 | 0 | 0 | 1 | 1 | 1 | 0 | 0 | 1 | 0 | 0 |
| 18 | 1 | 1 | 0 | 1 | 1 | 1 | 1 | 1 | 0 | 0 | 0 |
| 19 | 1 | 0 | 0 | 0 | 0 | 1 | 1 | 0 | 0 | 0 | 0 |
| 20 | 1 | 0 | 1 | 0 | 0 | 0 | 1 | 0 | 0 | 0 | 1 |
| 21 | 1 | 1 | 0 | 1 | 0 | 0 | 0 | 0 | 0 | 1 | 1 |
| 22 | 1 | 0 | 0 | 0 | 1 | 0 | 0 | 1 | 1 | 0 | 1 |
| 23 | 1 | 1 | 1 | 0 | 1 | 0 | 0 | 0 | 1 | 1 | 1 |
| 24 | 1 | 1 | 1 | 1 | 1 | 0 | 1 | 1 | 1 | 1 | 0 |
| 25 | 1 | 1 | 0 | 0 | 0 | 1 | 1 | 1 | 0 | 0 | 1 |
| 26 | 1 | 0 | 1 | 1 | 0 | 1 | 0 | 0 | 1 | 1 | 0 |
| 27 | 1 | 1 | 1 | 1 | 0 | 1 | 0 | 1 | 1 | 1 | 0 |
| 28 | 1 | 0 | 1 | 0 | 1 | 1 | 1 | 0 | 1 | 0 | 0 |
| 29 | 1 | 0 | 1 | 1 | 1 | 1 | 1 | 1 | 1 | 0 | 0 |
| 30 | 1 | 1 | 1 | 1 | 1 | 1 | 1 | 1 | 1 | 1 | 1 |
| 31 | 1 | 0 | 0 | 0 | 0 | 0 | 0 | 0 | 0 | 0 | 0. |

11. The apparatus of claim 7, wherein the (32, O) code is circularly repeated to produce the (48, O) code by using the offset starting value in a modified rate matching formula of: $q_i = b_{((i+\text{offset}) \bmod B)}$ where $i = 0, 1, 2, \ldots, Q-1$ with $Q = 48$.

12. The apparatus of claim 7, wherein the extended basis sequences for the (32, O) code is:

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ |
|---|---|---|---|---|---|---|---|---|---|---|---|---|
| 0 | 1 | 1 | 0 | 0 | 0 | 0 | 0 | 0 | 0 | 0 | 1 | 1 |
| 1 | 1 | 1 | 1 | 0 | 0 | 0 | 0 | 0 | 0 | 1 | 1 | 1 |
| 2 | 1 | 0 | 0 | 1 | 0 | 0 | 1 | 0 | 1 | 1 | 1 | 1 |
| 3 | 1 | 0 | 1 | 1 | 0 | 0 | 0 | 0 | 1 | 0 | 1 | 1 |
| 4 | 1 | 1 | 1 | 1 | 0 | 0 | 0 | 1 | 0 | 0 | 1 | 1 |
| 5 | 1 | 1 | 0 | 0 | 0 | 1 | 1 | 1 | 1 | 0 | 1 | 1 |
| 6 | 1 | 0 | 1 | 0 | 1 | 0 | 1 | 0 | 1 | 1 | 1 | 1 |
| 7 | 1 | 0 | 0 | 1 | 1 | 0 | 0 | 1 | 1 | 0 | 1 | 1 |
| 8 | 1 | 1 | 0 | 1 | 1 | 0 | 0 | 1 | 0 | 1 | 1 | 1 |
| 9 | 1 | 0 | 1 | 1 | 1 | 0 | 1 | 0 | 0 | 1 | 1 | 1 |
| 10 | 1 | 0 | 1 | 0 | 0 | 1 | 1 | 1 | 0 | 1 | 1 | 1 |
| 11 | 1 | 1 | 1 | 0 | 0 | 1 | 1 | 0 | 1 | 0 | 1 | 1 |
| 12 | 1 | 0 | 0 | 1 | 0 | 1 | 0 | 1 | 1 | 1 | 1 | 1 |
| 13 | 1 | 1 | 0 | 1 | 0 | 1 | 0 | 1 | 0 | 1 | 1 | 1 |
| 14 | 1 | 0 | 0 | 0 | 1 | 1 | 0 | 1 | 0 | 0 | 1 | 0 |
| 15 | 1 | 1 | 0 | 0 | 1 | 1 | 1 | 1 | 0 | 1 | 1 | 0 |
| 16 | 1 | 1 | 1 | 0 | 1 | 1 | 1 | 0 | 0 | 1 | 0 | 1 |
| 17 | 1 | 0 | 0 | 1 | 1 | 1 | 0 | 0 | 1 | 0 | 0 | 1 |
| 18 | 1 | 1 | 0 | 1 | 1 | 1 | 1 | 1 | 0 | 0 | 0 | 0 |
| 19 | 1 | 0 | 0 | 0 | 0 | 1 | 1 | 0 | 0 | 0 | 0 | 0 |
| 20 | 1 | 0 | 1 | 0 | 0 | 0 | 1 | 0 | 0 | 0 | 1 | 0 |
| 21 | 1 | 1 | 0 | 1 | 0 | 0 | 0 | 0 | 0 | 1 | 1 | 1 |
| 22 | 1 | 0 | 0 | 0 | 1 | 0 | 0 | 1 | 1 | 0 | 1 | 0 |
| 23 | 1 | 1 | 1 | 0 | 1 | 0 | 0 | 0 | 1 | 1 | 1 | 1 |
| 24 | 1 | 1 | 1 | 1 | 1 | 0 | 1 | 1 | 1 | 1 | 0 | 1 |
| 25 | 1 | 1 | 0 | 0 | 0 | 1 | 1 | 1 | 0 | 0 | 1 | 1 |
| 26 | 1 | 0 | 1 | 1 | 0 | 1 | 0 | 0 | 1 | 1 | 0 | 0 |
| 27 | 1 | 1 | 1 | 1 | 0 | 1 | 0 | 1 | 1 | 1 | 0 | 1 |
| 28 | 1 | 0 | 1 | 0 | 1 | 1 | 1 | 0 | 1 | 0 | 0 | 1 |
| 29 | 1 | 0 | 1 | 1 | 1 | 1 | 1 | 1 | 1 | 0 | 0 | 1 |

-continued

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ |
|---|---|---|---|---|---|---|---|---|---|---|---|---|
| 30 | 1 | 1 | 1 | 1 | 1 | 1 | 1 | 1 | 1 | 1 | 1 | 0 |
| 31 | 1 | 0 | 0 | 0 | 0 | 0 | 0 | 0 | 0 | 0 | 0 | 0. |

\* \* \* \* \*